(12) United States Patent
Mahoney et al.

(10) Patent No.: US 7,651,830 B2
(45) Date of Patent: Jan. 26, 2010

(54) PATTERNED PHOTOACID ETCHING AND ARTICLES THEREFROM

(75) Inventors: Wayne S Mahoney, St. Paul, MN (US); Steven D. Theiss, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/756,866

(22) Filed: Jun. 1, 2007

(65) Prior Publication Data

US 2008/0299486 A1 Dec. 4, 2008

(51) Int. Cl.
  *G03F 7/09* (2006.01)
  *G03F 7/20* (2006.01)
  *G03F 7/30* (2006.01)
  *G03F 7/36* (2006.01)
  *G03C 1/77* (2006.01)

(52) U.S. Cl. .............. 430/270.1; 430/275.1; 430/272.1; 430/279.1; 430/311; 430/322; 430/323; 430/325; 430/326; 430/905; 430/909; 430/910; 430/914; 430/921; 430/925

(58) Field of Classification Search ........... 430/5, 430/176, 270.1, 273.1, 302; 428/500, 515
See application file for complete search history.

(56) References Cited

U.S. PATENT DOCUMENTS

| | | | |
|---|---|---|---|
| 3,935,334 A | 1/1976 | Narui et al. | |
| 3,987,037 A | 10/1976 | Bonham et al. | |
| 4,336,295 A | 6/1982 | Smith | |
| 4,714,631 A | 12/1987 | Auderheide | |
| 4,895,630 A | 1/1990 | Aufderheide | |
| 4,985,340 A | 1/1991 | Palazzotto et al. | |
| 5,017,461 A | 5/1991 | Abe | |
| 5,554,664 A | 9/1996 | Lamanna et al. | |
| 5,648,196 A | 7/1997 | Frechet et al. | |
| 5,691,101 A * | 11/1997 | Ushirogouchi et al. | ...... 430/176 |
| 6,015,735 A | 1/2000 | Shue et al. | |
| 6,265,459 B1 | 7/2001 | Mahoney et al. | |
| 6,632,115 B1 | 10/2003 | Tsujimura et al. | |
| 6,635,689 B1 | 10/2003 | Mahoney et al. | |
| 6,808,657 B2 | 10/2004 | Fansler et al. | |
| 6,841,333 B2 | 1/2005 | Lamanna et al. | |
| 6,949,207 B2 | 9/2005 | Jones et al. | |
| 7,087,194 B2 | 8/2006 | Jones et al. | |

(Continued)

FOREIGN PATENT DOCUMENTS

JP 85-010916 B 3/1976

(Continued)

OTHER PUBLICATIONS

Carcia, P. F. et al., "Oxide Engineering of ZnO Thin-Film Transistors for Flexible Electronics", *Journal of the SID*, 13(7), 547-554 (2005).

(Continued)

*Primary Examiner*—Sin J. Lee
(74) *Attorney, Agent, or Firm*—Stephen F. Wolf

(57) ABSTRACT

Provided is an article that comprises a substrate comprising an acid-etchable layer, a water-soluble polymer matrix, and a photoacid generator. Also provided is a method for patterning that can provide patterned layers that can be used to form electroactive devices.

23 Claims, 3 Drawing Sheets

U.S. PATENT DOCUMENTS

| | | | |
|---|---|---|---|
| 7,101,492 | B2 | 9/2006 | Parent et al. |
| 7,309,560 | B2 | 12/2007 | Sakamoto et al. |
| 7,361,718 | B2 | 4/2008 | Takei et al. |
| 2003/0190491 | A1* | 10/2003 | Jones et al. ............... 428/500 |
| 2003/0190555 | A1* | 10/2003 | Nagase ..................... 430/302 |
| 2003/0230549 | A1 | 12/2003 | Buchanan et al. |
| 2004/0130032 | A1 | 7/2004 | Gronbeck et al. |
| 2004/0134365 | A1* | 7/2004 | Mori ......................... 101/459 |
| 2004/0241480 | A1* | 12/2004 | Fansler et al. .............. 428/515 |
| 2005/0083307 | A1 | 4/2005 | Aufderheide et al. |
| 2005/0186515 | A1 | 8/2005 | Watkins |
| 2005/0221203 | A1* | 10/2005 | Fujii ............................ 430/5 |
| 2006/0246379 | A1 | 11/2006 | Jambor et al. |
| 2007/0072112 | A1* | 3/2007 | Prokopowicz et al. .... 430/270.1 |

FOREIGN PATENT DOCUMENTS

| | | |
|---|---|---|
| JP | 85-029636 B | 3/1976 |
| JP | 58-088142 A | 11/1981 |
| JP | 93-008599 B | 10/1984 |
| JP | 02-248952 | 10/1990 |
| JP | 02-248953 | 10/1990 |

OTHER PUBLICATIONS

Crivello, J.V., et al., "Chemistry and Technology of UV and EB Formulation for Coatings, Inks and Paints", vol. III, *SITA Technology Ltd.*, London, (1991).

Hoffman, R. L., "Zn-O Thin-Film Transistors: Channel Mobility", *Journal of Applied Physics*, 95(10), 5813-5819 (2004).

Hsieh, H. H. et al., "Scaling Behavior of ZnO Transparent Thin-film Transistors", *Applied Physics Letters*, 89, 041109 (2006).

Kirk-Othmer Encyclopedia of Chemical Technology, $4^{th}$ Edition, Supplement Volume, John Wiley and Sons, New York, (2001), pp. 235-255.

Lamanna, W. M., et al., "New Ionic Photo-acid Generators (PAGs) Incorporating Novel Perfluorinated Anions", *Proceedings of SPIE*, vol. 4690, *Advances in Resist Technology and Processing XIX*, Ted Fedynyshyn (Editor), (2002).

Murov, S. L., Handbook of Photochemistry, Marcel Dekker Inc., N.Y., 27-35 (1973).

Norris, B. J. et al., "Spin-coated Zinc Oxide Transparent Transistors", *J.Phys. D: Appl. Phys.*, vol. 36, pp. L105-L107 (2003).

*Research Disclosures*, 409, 40996 (May 1998).

*Research Disclosures*, 437, 437031 (Sep. 2000).

Siddiqui, J. et al., "ZnO Thin-film Transistors with Polycrystalline (Ba,Sr)TiO3 Gate Insulators", *Applied Physics Letters*, vol. 88, p. 212903 (2006).

Takata, T., et. al., "Photoinitiated cationic polymerization of epoxide with phosphonium salts as novel photolatent initiators", *Makromol. Chem, Rapid Commun.* vol. 14, pp. 203-206 (1993).

U.S. Appl. No. 11/278,166, Maag, J., et al. "Touch Screen Having Reduced Visibility Transparent Conductor Pattern", filed Mar. 31, 2006.

\* cited by examiner

PATTERNED PHOTOACID ETCHING AND ARTICLES THEREFROM

FIELD

This disclosure relates to methods of patterning using photoacid etching and articles made therefrom.

BACKGROUND

Integrated circuits include combinations of electroactive devices such as resistors, diodes, capacitors and transistors linked together by electrical connections. Thin film integrated circuits include a number of layers such as metal layers, dielectric layers, and active layers typically formed on a semiconductor material. Typically, thin film circuit elements and thin film integrated circuits are created by depositing various layers of material and then patterning the layers using photolithography in an additive or a subtractive process which can include a chemical etching step to define various circuit components.

Traditional integrated circuits can be built directly on a silicon chip. More recently, there has been an interest in flexible integrated circuits. It has been shown that semiconductors such as zinc oxide can be deposited on glass or plastic substrates that can then be used to build very useful integrated circuits. The current method used for patterning most layers in thin film integrated circuits, such as those found in flat panel displays, is to deposit a continuous layer of a given material (such as a semiconductor for thin film transistors), coat the layer with a photoresist, pattern the photoresist by exposure to radiation, develop the photoresist, and then etch away the unprotected parts of the continuous layer using either a dry or wet etching process to produce the patterned circuit element.

SUMMARY

In view of the foregoing, we recognize there is a need for a method of making thin film integrated circuits that is faster and involves fewer steps. It has been found that the patterning and the etching processes can be combined into one step eliminating the need for the photoresist development step and the acid etching step. Reducing the number of steps required to pattern layers in a thin film integrated circuit can result in substantial cost savings.

In one aspect, this invention provides an article comprising a substrate comprising an acid-etchable layer, a water-soluble polymer matrix, and a photoacid generator.

In another aspect, this invention provides a method for patterning, comprising providing a substrate comprising an acid-etchable layer and a water-soluble polymer matrix, providing a photoacid generator, exposing the substrate to actinic radiation, and removing the matrix.

In yet another aspect, this invention provides a method for patterning a layer of an electroactive device comprising providing a substrate comprising a conductive acid-etchable layer, adding a water-soluble polymer matrix and a photoacid generator to the substrate, exposing the device to actinic radiation, and removing the matrix.

This invention provides a streamlined, lower-cost process for patterning thin film integrated circuits that has fewer steps than the conventional process described above. It uses acid generated from a photoacid generator (PAG) held in a water-soluble polymer matrix to etch acid-sensitive coatings on substrates. The acid can be generated in patterns when the polymer matrix is exposed to radiation that has been patterned, for example, by passing it through a mask.

In this application:

the terms "a", "an", and "the" are used interchangeably with "at least one" to mean one or more of the elements being described;

the term "acid-etchable" refers to materials that react with generated acid to change the physical properties of those materials—properties such as, for example, conductivity, solubility, transparency, translucency, chromaticity, reflectivity, and the like;

the term "conductive" refers to materials that are electrically conductive or semiconductive;

the terms "pattern", "patterned", or "patterning" refer to a configuration or configurations or the process of making such configurations that can include regular arrays or random arrays of features or structures or a combination of both; and the term "water solubility rate" refers to the elapsed time required for a sample of material to dissolve completely when tested by the following procedure. 0.5 gm of sample is added to a 5 ml vial, 3 ml of water is added and the vial is capped. The time required for the sample to dissolve completely in the water while shaking the vial is recorded. The elapsed time for complete dissolution of the sample is the water solubility rate.

The above summary of the present invention is not intended to describe each disclosed embodiment of every implementation of the present invention. The Figures and the detailed description which follow more particularly exemplify illustrative embodiments.

DETAILED DESCRIPTION

Figure 1A:
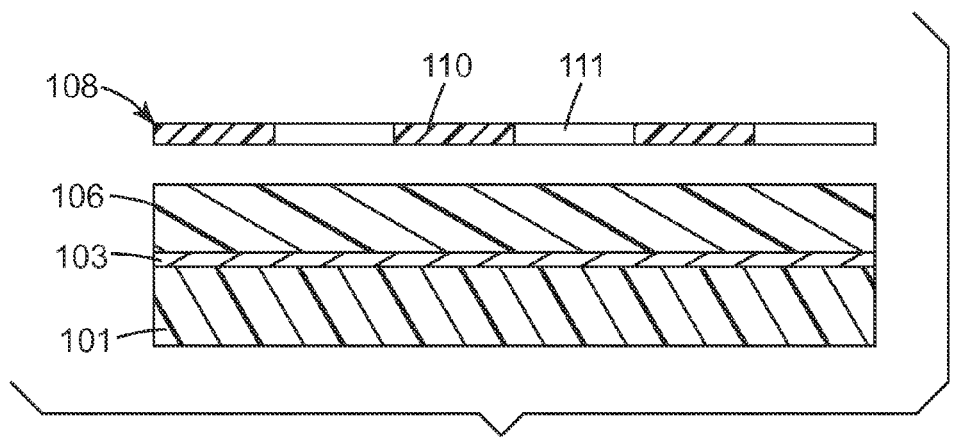
FIGS. 1a and 1b illustrate an embodiment of the invention that includes an article that includes a polymer matrix containing a photoacid generator and a photomask.

All numbers are herein assumed to be modified by the term "about". The recitation of numerical ranges by endpoints includes all numbers subsumed within that range (e.g., 1 to 5 includes 1, 1.5, 2, 2.75, 3, 3.80, 4, and 5).

Photoacid etching can be used to produce patterned articles. An article is provided that comprises a substrate comprising an acid-etchable layer, a water-soluble polymer matrix, and a photoacid generator. The patterned article can be easily fabricated using patterned photogenerated-acid as the etching agent. The photoacid generator can be patterned and then exposed to actinic radiation or, alternatively, the actinic radiation can be patterned by, for example, passing it through a mask. Combinations of patterned photoacid generators or radiation that is patterned are also contemplated by this disclosure.

The article includes a substrate. Substrates useful for this purpose include, for example, silicon wafers, thin glass plates, flexible glasses, and polymers such as polyimides, polyesters, metal foils, and the like. It is also contemplated that the substrates can include conductive materials such as those used as electrodes in the construction of thin film electronic devices. This includes such materials, for example, as aluminum, copper, gold, and silicon.

The substrate comprises an acid-etchable layer. Typically this can be a thin layer of an insulating, conducting or semi-conducting material that is deposited on the substrate. The acid-etchable layer can comprise conductors such as acid-etchable metallic layers. Acid-etchable metallic layers include, for example, conductive metals such as aluminum, titanium, silver, copper, and gold. The acid-etchable layer can also include metal oxides that are conducting or semiconducting. Metal oxides that are acid-etchable include, for example, zinc oxide, tin oxide, indium oxide, indium-tin oxide, and indium-gallium-zinc oxide. These metal oxides are particularly useful in that they are transparent and are therefore useful for making transparent electrodes which can be used in light-emitting electroactive devices such as light-emitting diodes or photoactive devices such as photovoltaic cells. Other acid-etchable layers that can be useful in this invention include insulators or dielectrics such as metal oxides and metal nitrides, for example, aluminum oxide, zinc oxide, titanium dioxide, silicon dioxide, and silicon nitride. The acid-etchable layer can also be a surface of the substrate itself.

As used herein, acid-etchable layers can refer to layers of materials that react with photogenerated acids to change some important physical property of that material, such as, for example, solubility. However other important physical properties of the material that can change, and that are within the context of the term "acid-etchable", include electrical or thermal conductivity, transparency, chromaticity, translucency, and reflectivity. The acid-etchable layer can be the surface of the substrate itself. For example, if the substrate is glass, the acid-etchable layer can be the surface of the glass which can change in transparency (or reflectivity) when exposed to acids such as hydrofluoric acid.

The article includes a water-soluble polymer matrix. The matrix can comprise components such as a water-soluble, film-forming polymer, a solubility accelerator, and solid particulates that are insoluble in the film-former. The matrix can be removed from the substrate in about 30 minutes or less, about 15 minutes or less, about 5 minutes or less, or even about one minute or less when washed with water. Rapid removal of the matrix can help to prevent diffusion of acid into unexposed areas, which can lower the resolution of the patterned area.

The first component of the matrix is a water soluble film-forming polymer. Suitable polymers generally can have an $M_n$ of at least 2,000, usually in the range of 2,000 to 400,000. Film-forming polymers are polymers that can be coated to produce a thin, continuous, sheet of material. The film-forming polymer can provide the coating matrix within which other ingredients are carried. Although polymers of this type are water soluble, they can dissolve slowly. Suitable water soluble polymers usually have a water solubility rate in the range of 1 minute to 10 hours, and generally the most useful water soluble polymers have a water solubility rate of 1 minute to 4 hours. Film-forming polymers can include, for example, polyvinyl alcohol ($M_n$ of 3,000), poly (acrylic acid) ($M_n$ of 90,000 or greater) and polyvinyl pyrrolidone ($M_n$ of 40,000 or 360,000). Other water-soluble, film forming polymers known to those skilled in the art can be used.

The second ingredient of the polymer matrix of this invention can optionally be a solubility accelerator. This solubility accelerator can comprise a water soluble compound that is also compatible with the film-forming polymer and acts to speed up the rate of dissolution of a coating made with the polymer. The solubility accelerator dissolves in water much more rapidly than the polymer and useful compounds are those that have a water solubility rate of 30 minutes or less. Compounds suitable as a solubility accelerator can have an average molecular weight of about 1000 or less. Specific compounds useful as a solubility accelerator in combination with the film-forming polymer can include salts such as, for example, sodium acetate, sodium bromide, sodium carbonate, sodium chloride, sodium iodide, sodium sulfate, potassium bromide, potassium chloride, magnesium bromide, ammonium carbonate and lithium chloride; organic acids such as, for example, citric acid, tartaric acid and toluenesulfonic acid; and organic alcohols such as, for example, glycerol, sorbitol and tetraethylene glycol. Materials also useful as solubility accelerators can include polysaccharides such as starch, corn starch, amylopectin, maltodextrins, or corn syrup solids. The solubility accelerator can also include monosaccharides such as glucose or fructose, or disaccharides such as sucrose, maltose, or lactose. The solubility accelerator can be present in any useful amount. In many embodiments the solubility accelerator is present in the range of about 1 wt % to about 50 wt % of the total matrix weight. Although not wishing to be bound by any theory, it is believed that the solubility accelerators are dissolved or finely dispersed in the film-forming polymer of the coatings and act, during water washing of the coatings, to quickly dissolve from around the polymer chains and thereby increase the solubility rate of the resist.

The third ingredient of the polymer matrix can optionally be a solid particulate material that is insoluble in the film-forming polymer and thereby provides the dried matrix with an irregular or rough surface topology. The uneven surface topology of the dried matrix is believed to aid water solubility by two mechanisms. The matrix can have increased surface area that acts to speed up the water washing of the matrix. Specific solid particulates can include aluminum powder, carbon black, silica, sodium potassium aluminum silicate, fine glass beads, talc, clays, and $TiO_2$ coated mica. The solid particulate can have a very small particle size since the matrix is often applied as a thin layer, but solids with a particle size up to about 50 μm can be useful.

Other ingredients can optionally be included in the polymer matrix in small amounts for specific purposes, such as defoamers, plasticizers, leveling agents, dyes, pigments, or organic solvents. Water-soluble polymer matrices of this invention can include the undercoatings that are disclosed in U.S. Pat. Nos. 4,714,631 and 4,895,630 (both to Aufderheide) and the water-soluble paints disclosed in U.S. Pat. No. 3,935,334 (Narui et al), hereby incorporated by reference in their entirety.

Other water-soluble polymer matrices that can be useful in this invention include water soluble masks, such as, for example CHEMTRONICS CW8 water-soluble solder mask, available from Peuro Distribution, LLC., Cleveland, Ohio or WONDERMASK WSOL 2204 water-soluble solder mask, available from TechSpray, Amarillo, Tex. Other useful polymer matrix materials can include, for example polymeric matrix materials disclosed in U.S. Pat. No. 5,017,461 (Abe) and water-soluble matrix materials and water-soluble photo-acid generators disclosed in U.S. Pat. No. 5,648,196 (Frechet et al.) the disclosures of which are hereby incorporated by reference in their entirety.

The water-soluble polymer matrices of this invention can include any water-soluble polymer matrices that are easily coatable onto the substrate, have a high enough viscosity to not flow significantly on the substrate after coating, are unreactive to any photoacid generator dissolved or dispersed therein, are unreactive to any acid generated by the photoacid generator, can allow diffusion to the substrate of acid generated by the photoacid generator, and can be easily and quickly removed by washing with a highly polar solvent such as water. Additionally they should be polymers that do not interact with the radiation used to activate the photoacid generator or directly with the irradiation process. By "do not interact" it is meant that the water solubility of the polymer matrix is not significantly changed upon exposure to radiation. Additives such as the solubility accelerators as well as viscosity modifiers, defoamers, plasticizers and/or organic solvents are optional and can be present as needed to modify coating and washing characteristics of the matrix.

The water solubility of the polymeric matrix does not significantly change after irradiation with a wavelength of actinic radiation that activates the photoacid generator of an article of this invention. By this it is meant that the water solubility of the polymeric matrix in areas exposed to wavelengths of light that activate the photoacid generator is not changed by less than about 50%, less than about 40%, less than about 30%, less than about 20%, or even less than about 10% compared with areas not exposed to actinic radiation, e. g. areas that have been blocked from exposure by a mask.

The water-soluble polymer matrix of this invention can include a photoacid generator. Upon irradiation with actinic radiation, photoacid generators undergo a fragmentation reaction and release molecules of Lewis or Brönsted acids that can diffuse through the polymer matrix to the acid-etchable layer. The released acid molecules can then react with acid labile groups of the acid-etchable layer. Useful photoacid generators are thermally stable, do not undergo thermally induced reactions with the matrix polymer or with the acid-etchable layer prior to irradiation, and are readily dissolved or dispersed in the matrix. Preferred photoacid generators are those in which the incipient acid has a pKa value of $\leq 0$.

The photoacid generators include ionic photoacid generators, including onium salts and organometallic salts, such as iron arene complexes; and nonionic photoacid generators, including organosilanes, latent sulfonic acids and other nonionic compounds, such as halomethyl triazines (such as those described in U.S. Pat. No. 3,987,037 (Bonham et al.), incorporated herein by reference) and chlorinated acetophenones. Photoacid generators are known and reference may be made to J. V. Crivello and K. Dietliker, *Chemistry and Technology of UV and EB Formulation for Coatings, Inks and Paints, vol. III*, SITA Technology Ltd., London, 1991. Further reference may be made to *Kirk-Othmer Encyclopedia of Chemical Technology*, 4th Edition, Supplement Volume, John Wiley and Sons, New York, 2001, pp 253-255.

Useful onium salts include diazonium salts, such as aryl diazonium salts; halonium salts, such as diaryliodonium salts; sulfonium salts, such as triarylsulfonium salts; selenonium salts, such as triarylselenonium salts; sulfoxonium salts, such as triarylsulfoxonium salts; and other miscellaneous classes of onium salts such as tetrasubstituted phosphonium salts described by Endo et. al. in *Makromol. Chem, Rapid Commun.* 14, 203-206 (1993), and pyrylium and thiopyrylium salts. Triarylsulfonium halide salts, such as triarylsulfonium chloride, can be particularly useful in this invention.

Useful latent sulfonic acids include α-sulfonyloxy ketones; α-hydroxymethylbenzoin sulfonates; o-nitrobenzyl esters of sulfonic acids; aryl diazidonapthaquinone-4-sulfonates; α-sulfonyl acetophenones; methanesulfonate esters of 2-hydroxy and 2,4-dihydroxybenzophenone (in the presence of thiols); sulfonated N-hydroxy amides or imides; and iminosulfonates. Other useful photoactivatable salts for this invention can include salts comprising fluorocarbon anion salts such as those disclosed in U.S. Pat. Nos. 5,554,664 and 6,841,333 (both to Lamanna et al.) which are hereby incorporated by reference. Also useful are species that generate nitric acid, acetic acid, and hydrofluoric acid upon exposure to radiation. Exemplary materials include triarylsulfonium nitrate, acetate, and fluoride salts.

The polymer matrix can be applied to the acid-etchable layer in a variety of ways. For example, the polymer matrix can be dissolved or dispersed in a solvent, such as an aqueous solvent, any additives (including the photoacid generator) can be incorporated into the solution and a variety of well known solution coating methods can be used. These methods include, for example, knife coating, blade coating, roll coating, dip coating, or any other coating methods for aqueous solutions known to those skilled in the art. The polymer matrix can also be applied by known printing methods such as, for example, gravure printing, flexographic printing, screen printing, lithographic printing or other printing techniques known in the art. Additionally, it is contemplated that the polymer matrix can be applied by non-solvent techniques such as hot melt coating or by reactive vapor deposition or plasma coating of reactive monomers using techniques known in the art. The polymer matrix can be applied to the substrate in a patterned manner by any of the techniques listed above. This can be done by applying a mask—such as, for example, a resist mask—to the substrate surface and then pattern coating the solution comprising the polymer matrix through the mask. The mask can comprise a mask made out of photoresist (positive or negative), a screen, or any other mask that can be used to pattern a solution. The polymer matrix can be allowed to dry at room temperature before use or can be heated at elevated temperature to make the surface tack-free. Additionally, a separate polymer matrix layer can be laminated or bonded to the substrate by heat, pressure, or by means of adhesives. If adhesives are used, the intermediate adhesive layers should not deleteriously affect the diffusion of the incipient acid through the polymer matrix to the acid-etchable substrate.

The photoacid generator can be a part of a separate layer adjacent to the water-soluble polymer matrix. In one embodiment, this layer (a donor layer) can comprise a coating of only the photoacid generator on a surface of the polymer matrix. In another embodiment, the photoacid generator can be dissolved or dispersed in a polymer, such as a hydrophobic polymer, to comprise the donor layer. The donor layer can be adjacent to, and in contact with, the polymer matrix.

The photoacid generator can be pattern-coated on the polymer matrix, which can permit the generation of patterned acid-etching upon irradiation. In such cases, the thickness of the donor layer may be very thin—on the order of a few microns If the donor layer comprises the photoacid generator dissolved or dispersed in an adjacent polymer layer, the donor layer can be chosen from any polymer that is non-reactive toward both the photoacid generator and the incipient acid generated therefrom, and allows diffusion of the incipient acid through the polymer matrix and to the substrate. Generally the acid donor layer comprises a coating of a non-basic polymer, which has a high rate of permeability of the incipient acid through the matrix. The donor layer can comprise a hydrophobic polymer. A "hydrophobic" polymer is a polymer that is substantially insoluble in and will not swell appreciably in water. The donor layer can also comprise an amorphous polymer layer. The rate of permeability of the incipient acid is a function of the combination of the rate of absorption of the incipient acid by the matrix, the rate of diffusion of the acid through the matrix, and the rate of desorption of the acid from the interface of the donor layer and the polymer matrix layer. Less permeable polymers can also be used for the donor layer, provided a barrier layer is used to prevent the loss of acid from the surface(s). The thickness of such a donor layer can be from about 2 μm to about 100 μm. Generally, the amount of photoacid generator in the donor layer can be from about 0.1 to about 50 wt %, relative to the weight of the donor layer polymer.

Because the solubility of the incipient acid in, and the diffusion of the incipient acid through the polymer matrix is a function of Henry's and Fick's laws respectively, the $T_g$ of the acid donor layer is preferably at or below 25° C., and is more preferably below about 0° C. Polymers in the glassy state are generally less permeable than those in the rubbery state, so polymers in the rubbery state can be useful as donor layers. Useful donor layers include, but are not limited to, adhesives such as tackified natural rubbers, tackified synthetic rubbers, tackified styrene block copolymers, self-tacky or tackified acrylate or methacrylate copolymers, self-tacky or tackified poly(α-olefins), and tackified silicones.

In one embodiment, a donor layer comprising the photoacid generator can be coated on a surface of the polymer matrix layer. The methods that can be utilized to coat the donor layer can include solution coating from a solvent dispersion or from a solution by methods known to those skilled in the art and those named above for the matrix layer. Alternatively the donor layer can be coated from the melt, coextruded, or a separately prepared donor layer can be laminated or bonded to the polymer matrix layer by heat, pressure, or by means of adhesives. If adhesives are used, the intermediate adhesive layers should not deleteriously affect the diffusion of the incipient acid from the donor layer to the polymer matrix layer. If desired, the donor layer can be patterned by any of the techniques described above for the polymer matrix.

The photoacid generator can be used in amounts sufficient to effect rapid reaction with the acid-etchable layer. The amount of the photoacid generator necessary to effect rapid reaction of the acid-etchable layer can depend on the quantum yield of the photoacid generator (the number of molecules of acid released per photon absorbed), the $pK_a$ of the acid, the permeability of the polymer matrix, the amount of water present in the polymer matrix, the wavelength and duration of irradiation and the temperature. Generally the photoacid generator can be used in amounts from about 0.1 wt % to about 50 wt %, from about 1 wt % to about 30 wt %, or even from about 5 wt % to about 25 wt % relative to the amount of polymer matrix.

Optionally, it is within the scope of this invention to include photosensitizers or photoaccelerators with the photoacid generators. Use of photosensitizers or photoaccelerators can alter the wavelength sensitivity of radiation-sensitive compositions employing the latent catalysts and photoacid generators of this invention. This is particularly advantageous when the photoacid generator does not strongly absorb the incident radiation. Use of photosensitizers or photoaccelerators can increase the radiation sensitivity, allowing shorter exposure times and/or use of less powerful sources of radiation. Any photosensitizer or photoaccelerator may be useful if its triplet energy is at least 30 kilocalories per mole. Examples of such photosensitizers are given in Table 2-1 of the reference Steven L. Murov, *Handbook of Photochemistry*, Marcel Dekker Inc., N.Y., 27-35 (1973), and include those described in U.S. Pat. No. 4,985,340 (Palazzotto et al.). Examples of photoaccelerators can include, for example, those disclosed in U.S. Pat. Nos. 6,265,459 and 6,635,689 (Mahoney et al.). All of these references are hereby incorporated by reference. When present, the amount of photosensitizer or photoaccelerator used in the practice of the present invention is generally less than about 10 wt % or even less than about 1.0 wt % of photosensitizer or photoaccelerator based on the weight of the photoacid generator.

Figure 1B:
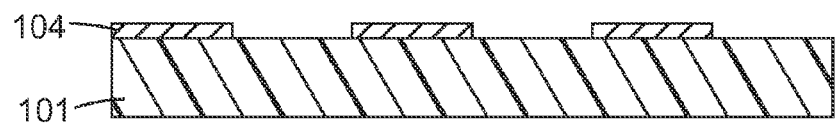

FIG. 1a is an illustration of an embodiment of an article of this invention. The article comprises a substrate 101 that includes an acid-etchable layer 103 on the substrate. A water-soluble polymer matrix 106 is adjacent and in contact with the acid-etchable layer 103. The water-soluble polymer matrix 106 contains a photoacid generator dissolved or dispersed in it. Also shown is a photomask 108 that has areas that are opaque to actinic radiation 110 and areas that are transparent to actinic radiation 111. In practicing a method of this invention, the article of FIG. 1a is subjected to actinic radiation external to the photomask 108. Actinic radiation is allowed to pass through the photomask 108 in regions 111 that are transparent to its wavelengths. The radiation exposes the photoacid generator in the polymer matrix 106 directly below the transparent regions. The generated acid etches the acid-etchable layer 103 where it is generated. Essentially no acid is generated in regions directly below opaque areas of the mask 108. After development (removal of the polymer matrix and etched regions), what is left is shown in FIG. 1b. FIG. 1b has substrate 101 that has patterned regions of material 104 (the same as material 103) remaining from the acid-etchable layer.

Figure 2A:
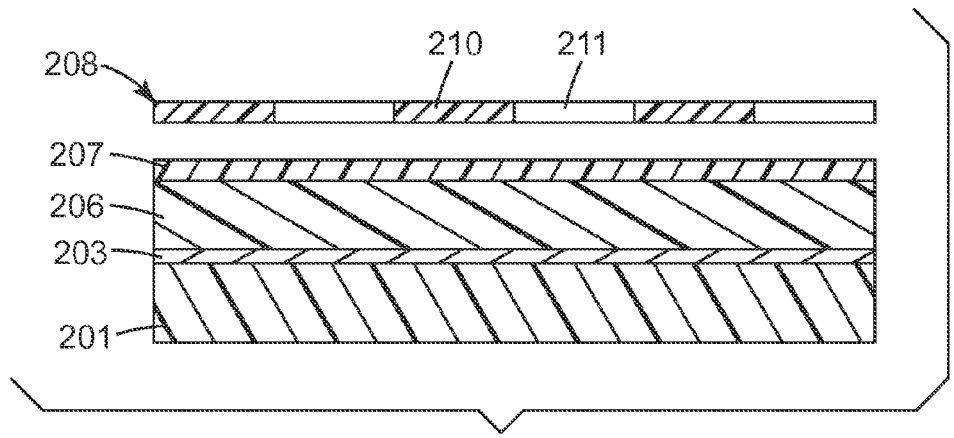
FIG. 2a illustrates an embodiment of the invention that includes an article with a polymer matrix and a donor layer containing a photoacid generator and a photomask.
Figure 2B:
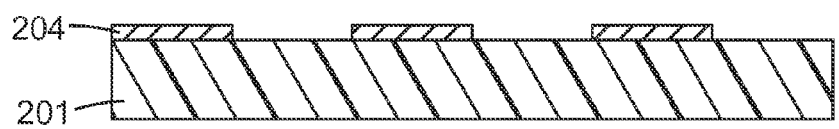
FIG. 2b illustrates the embodiment of the invention shown in FIG. 2a after exposure and development.

FIG. 2a is an illustration of another embodiment of this invention. The article comprises a substrate 201 that includes an acid-etchable layer 203 on the substrate. A water-soluble polymer matrix 206 is adjacent to and in contact with the acid-etchable layer 203. A donor layer 207 is adjacent to and in contact with the polymer matrix layer. The donor layer 207 contains a photoacid generator dissolved or dispersed in it. Also shown is a photomask 208 that has areas that are opaque to actinic radiation 210 and areas that are transparent to actinic radiation 211. In practicing a method of this invention, the article of FIG. 2a is subjected to actinic radiation external to the photomask 208. Actinic radiation passes through the photomask 208 in regions 211 that are transparent to its wavelengths. The radiation exposes the photoacid generator in the donor layer 207 directly below the transparent regions. The generated acid is released in the donor layer 207, diffuses into and through the polymer matrix 206 and comes into contact with the acid-etchable layer 203 of the substrate 201. The generated acid etches (solubilizes) the acid-etchable layer 203 where it is generated. Essentially no acid is generated in regions directly below opaque areas of the mask 210. After development (removal of the polymer matrix and etched regions), what is left is shown in FIG. 2b. FIG. 2b has substrate 201 that has regions of unetched material 204 (the same as material 203) remaining.

In another aspect this invention provides a method for patterning comprising providing a substrate comprising an acid-etchable layer and a water-soluble polymer matrix, providing a photoacid generator, exposing the substrate to actinic radiation, and removing the matrix.

The substrate of this method includes an acid-etchable layer. The acid-etchable layer can be a layer added to the substrate or the surface of the substrate itself. The acid-etchable layer has been described above. The substrate of this method includes a water-soluble polymer matrix. The polymer matrix has been described above.

The substrate of this method can also include a photoacid generator. Useful photoacid generators have been disclosed above. The substrate can comprise a wide variety of photoacid generators. The photoacid generators can be coated directly onto the substrate patterned or unpatterned, can be incorporated (as a solute or dispersion) into the polymer matrix which can be coated onto the substrate, or can be incorporated into a donor layer that is coated on top of the polymer matrix as described earlier. The photoacid generators can release acid upon exposure to actinic radiation. The radiation can be in the visible range (400 nm to 750 nm) or can be in the infrared range (>750 nm) or in the ultraviolet (UV) range (<400 nm). UV radiation can be particularly useful. Combinations of wavelength regions can also be useful for this invention.

The method of this disclosure further includes exposing the substrate to actinic radiation. The radiation can be patterned by passing it through a photomask that is in contact with the layer that includes the photoacid generator, by projection of a radiative pattern onto the layer through a mask or otherwise, by writing a pattern with a laser onto the photosensitive matrix layer, by interference lithography or by any other means known by those of skill in the art that can generate patterns by radiative exposure. When writing a pattern with a laser, the laser beam can be passed through a mask or can be scanned digitally, or rastered to expose a latent pattern onto the photosensitive layer—the layer that comprises the photoacid generator. Additionally, it is contemplated that the patterned exposure can be created by having an opaque element of an already existing element of an electroactive device serve as a mask for the radiation.

After exposure to radiation, the polymer matrix can be removed from the substrate by washing with a polar solvent. Since the polymer matrix is water-soluble, preferred solvents for removing the matrix can be highly polar solvent or cosolvent systems. These solvent systems can comprise water. When a donor layer is present, the polymer matrix, which can be adjacent to the acid-etchable layer on the substrate, is dissolved and the donor layer, which may not be soluble in the same solvent, can be released from the acid-etchable layer. It is sometimes desirable to minimize the amount of exposure of the acid-etchable layer to the photogenerated acidic species. After exposure to actinic radiation, acidic species are generated in either the polymer matrix or the donor layer. They can migrate to the acid-etchable layer, and etch that layer. The acid needs to be allowed to contact the etchable layer long enough to react with the etchable layer. But extended exposure can allow lateral diffusion of the acid into "unexposed" areas. This can reduce the resolution of the features that can be created by acid etching. After enough time has elapsed to etch the desired areas of the acid-etchable layer, the polymer matrix can be quickly removed to reduce lateral diffusion of the acidic species.

A method for patterning a layer of an electroactive device is provided comprising providing a substrate comprising a conductive acid-etchable layer, adding a water-soluble polymer matrix and a photoacid generator to the substrate, exposing the device to actinic radiation, and removing the matrix. The acid-etchable layer can be transformed into a layer that will become an insulating, conducting or a semiconducting component of an electroactive device. For example, the acid-etchable layer can become, after etching, a conductive trace for interconnecting electroactive devices on an integrated circuit, an electrode of a diode or an organic light-emitting diode (OLED), a source, drain, and/or gate electrode of a thin film transistor, a semiconducting layer of a thin-film transistor, or a dielectric for use in a capacitor.

In another aspect, the method for patterning a layer of an electroactive device of this disclosure can be used to make electroactive devices. Electroactive devices made by this method can include devices that require patterned conductors or patterned semiconductors. Examples of such electroactive devices can include, for example, thin film transistors, diodes, light-emitting diodes, capacitors, resistors, or any other device that requires patterned electrodes or patterned semiconductors. Thin film transistors can include complementary metal oxide semiconductor (CMOS) devices.

The electroactive devices of this disclosure can be incorporated into an integrated circuit. An integrated circuit can include one or more of these devices. Additionally, a large number of integrated circuits can be made in one process, for instance, on a large sheet or roll. The method of acid-etching can be used to separate one device from another or one integrated circuit from another. This can be accomplished, for example, by exposure of a partially-made organic light-emitting device (OLED) through a transparent electrode where another opaque electrode masks the radiation. This can be useful as shown in Example 1, for making or improving the performance of an electroactive device, such as a thin film transistor.

The objects, features, and advantages of the present invention are further illustrated by the following examples, but particular materials and amounts thereof recited in these examples, as well as other conditions and details, should not be construed to unduly limit this invention. All materials are commercially available or known to those skilled in the art unless otherwise stated or apparent.

EXAMPLES

TABLE I

| Materials Used in Examples | |
|---|---|
| Triarylsulfonium chloride (Ar$_3$SCl) aqueous solution (50% solids) | Aceto Corporation (Lake Success, NY) |
| AIRVOL 603 Polyvinyl Alcohol | Air Products Inc. (Allentown, PA) |
| Dextrose | |
| BYK 020 | Byk-Chemie USA (Wallingford, CT) |
| ARCOSOLVE PM | Lyondell (Houston TX) |
| LOVEL-28 | PPG Industries (Pittsburgh, PA) |
| CAB-O-SIL PTG | Cabot Corp. (Billerica, MA) |
| Blue Pigment (TINT-AYD CW 5228) | Elementis (Jersey City, NJ) |

Preparatory Example 1

Preparation of Solid, Triaryl Sulfonium Chloride Salt

Under low room light, aqueous triarylsulfonium chloride (300 g) was transferred to a 1 L round bottom flask and concentrated by rotary evaporation at 60° C. to give a viscous oil. The oil was poured into an aluminum baking sheet (12" (30.5 cm) h×8" (20.3 cm) w×1" (2.54 cm), from Pactiv Corp. Lake Forest, Ill.) and dried overnight in a vacuum oven at 45° C. A brittle foam had formed, which was pulverized by hand, to give the solid triarylsulfonium chloride salt (110 g) as a pale yellow solid.

Preparatory Example 2

Preparation of Polymer Matrix

A water soluble matrix essentially the same as the matrix described in Example 6 of U.S. Pat. No. 4,895,630 (Aufderheide) was used. The composition of the matrix is shown in Table II below.

TABLE II

Components of Water-soluble Matrix

| Component | Parts by weight |
|---|---|
| Deionized Water | 28.5 |
| AIRVOL 603 Polyvinyl Alcohol | 16.0 |
| Dextrose | 15.6 |
| BYK020 | 0.6 |
| ARCOSOLVE PM | 26.7 |
| LOVEL-28 | 8.9 |
| Blue Pigment (TINT-AYD CW 5228) | 0.9 |
| CABO-O-SIL PTG | 2.9 |

The water soluble matrix (75.06 g) and solid triarylsulfonium chloride salt (25.03 g) were combined in a plastic beaker and stirred by hand using a wooden applicator stick. After 20 minutes stirring, the resulting photoetchant was transferred to a 125 mL brown, wide-mouth poly(ethylene terephthalate) (PET) bottle.

Example

Figure 3:
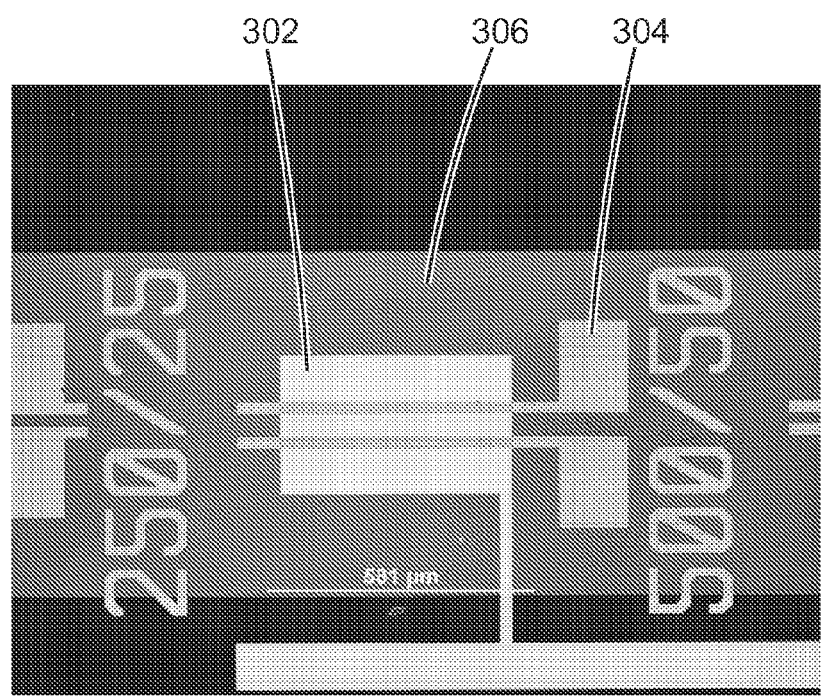
FIG. 3 is a photomicrograph of a thin film transistor of Example 1 that has ZnO between the source and drain electrodes.

A substrate that included a completed set of ZnO-based test transistors and simple TFT backplanes for PDLC (phase dispersed liquid crystal) displays was fabricated by methods known by those skilled in the art. The devices included an aluminum gate layer (under the gate dielectric), an anodized aluminum oxide ($Al_2O_3$) gate dielectric 302, Ti/Au source/drain electrodes 304 and a ZnO semiconductor layer 306, in that order, on a Corning 1737 glass substrate. A photomicrograph of the sample at this stage is shown in FIG. 3. In order for the TFTs (including the one illustrated in FIG. 3) to operate in an optimum fashion it was found to be useful to further pattern the ZnO beyond that shown above, to remove the ZnO that was not directly over the Al-gated areas.

Therefore, the sample was coated with the polymer matrix mixture from Preparatory Example 2. The thickness of the polymer matrix was controlled by placing strips of SCOTCH tape on two edges of the sample. The polymer matrix was then bladed onto the sample using the edge of a microscope slide. The sample was then attached, upside down, to a carrier board and fed through a UV Processor (Fusion UV Systems, Gaithersburg, Md.) with the belt speed set such that the sample received a UV dose of approximately 1 Joule/$cm^2$ for each pass through the processor. This energy was calibrated by taping a glass slide with the same thickness of ZnO (~55 nm) onto the sensor of the radiometer (UV Power Puck from EIT Inc. Sterling, Va.) and feeding the puck through the furnace. A total dose of ~7 Joules/$cm^2$ was found to be needed to fully etch the ZnO layer. Accordingly, the TFT sample was passed through the UV furnace 8 times, for a total dose of ~8 Joules/$cm^2$. The existing metal lines of the source and drain electrodes acted as a mask for the UV, with the HCl being generated only in the exposed areas.

Figure 4:
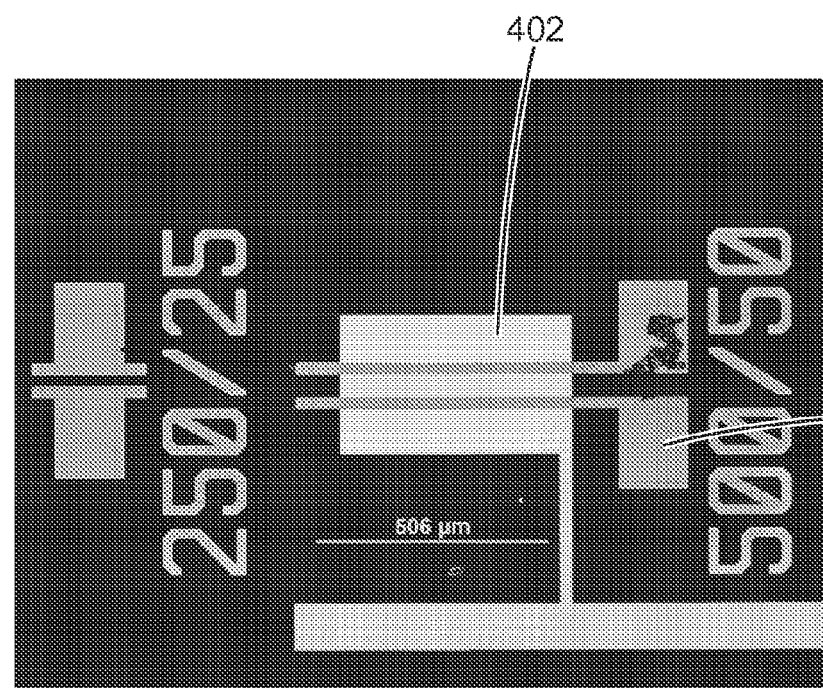
FIG. 4 is a photomicrograph of a thin film transistor of Example 1 that has had the ZnO between the source and drain electrodes etched according to a method of this invention.

The exposed sample was then placed in DI water and ultrasound was applied to remove the polymer matrix. The polymer matrix removal was also aided by the use of a foam-tipped swab. The micrograph after the polymer matrix was removed is shown in FIG. 4. The ZnO semiconductor has been removed from all areas that were exposed to the acid-etching. The semiconductor only remains under the gate dielectric 402 and under the source/drain electrodes 404.

Figure 5:
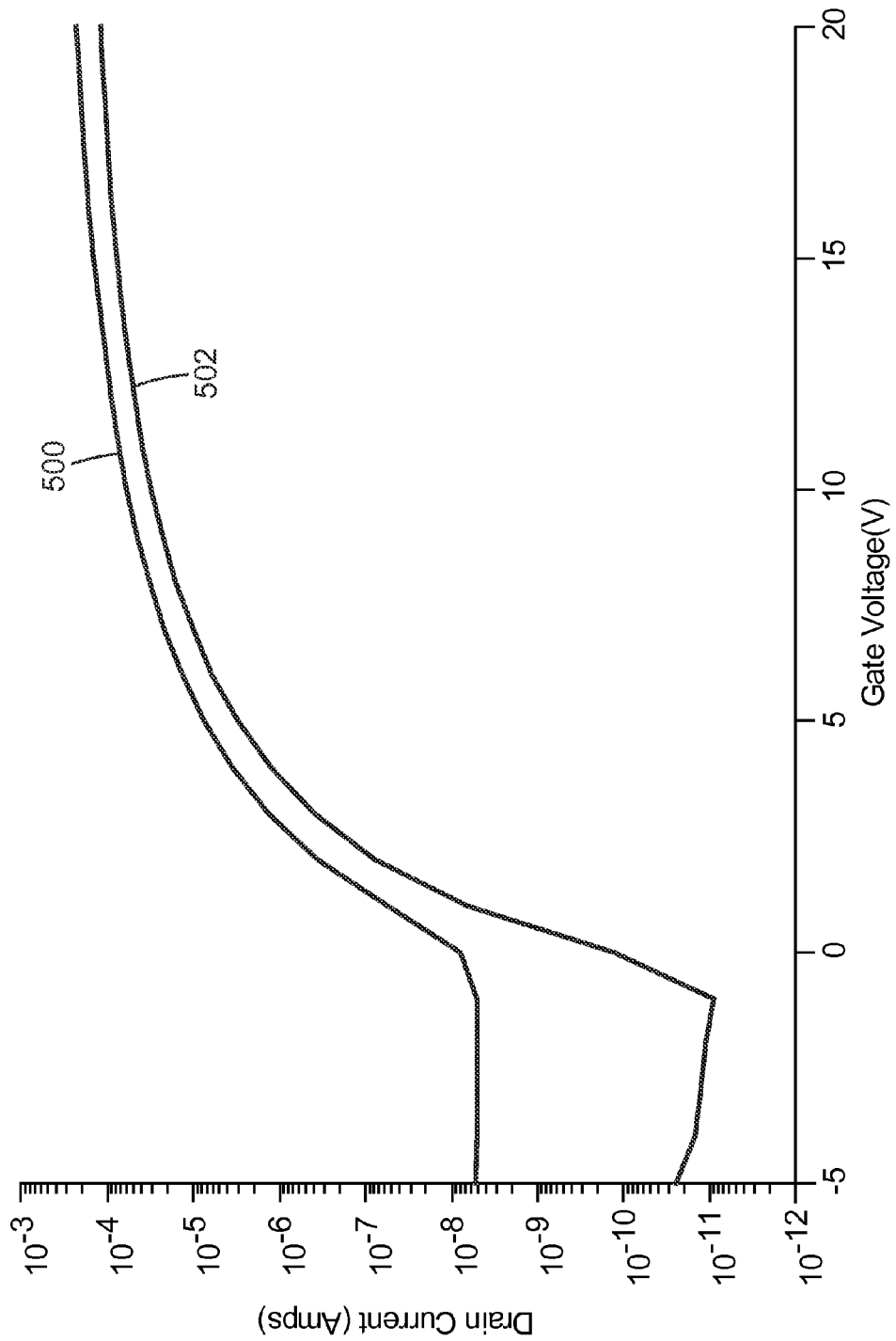
FIG. 5 is a graph of the performance characteristics of the thin film transistor of Example 1 before and after photoacid etching.

FIG. 5 is a graph of performance characteristics of the TFT shown in FIG. 3 (before removal of the ZnO) and FIG. 4 (after acid-etching). It can be observed that the performance characteristics of the TFT have greatly improved after the ZnO removal between the electrodes. Before the removal of the ZnO, a graph 500 of the performance characteristics of the TFT show significant current leakage below a gate voltage of around zero volts. The performance characteristics of the TFT after removal of the ZnO are shown in curve 502 and show much lower drain current at the same voltage.

What is claimed is:

1. An article comprising:
   a substrate an acid-etchable metallic, metal oxide, or metal nitride layer disposed upon the substrate;
   a water-soluble polymer matrix in contact with the acid-etchable layer; and
   a photoacid generator in contact with the water-soluble polymer matrix;
   wherein the polymer matrix comprises a film-forming polymer and a solubility accelerator,
   wherein the polymer matrix is unreactive to the photoacid generator and any acid generated by the photoacid generator,
   wherein the photoacid generator comprises an onium salt, and
   wherein the water solubility of the polymer matrix is not significantly changed upon exposure to radiation.

2. The article of claim 1 wherein the acid-etchable layer comprises a conductive metal or metal oxide.

3. The article of claim 2 wherein the metal oxide is selected from zinc oxide and indium-tin oxide.

4. The article of claim 1 wherein the accelerator is selected from salts, organic acids, organic alcohols, saccharides, and combinations thereof.

5. The article of claim 1 wherein the film-forming polymer comprises at least one of a poly(vinyl alcohol), a poly(acrylic acid), and a poly(vinyl pyrrolidone).

6. The article of claim 5 wherein the film-forming polymer comprises poly(vinyl alcohol).

7. The article of claim 5 wherein the film-forming polymer comprises a water-soluble solder mask.

8. The article of claim 1 wherein the acid generated from the photoacid generator is patterned.

9. The article of claim 1 wherein the polymer matrix comprises the photoacid generator.

10. The article of claim 9 wherein the photoacid generator comprises a triarylsulfonium chloride.

11. The article of claim 1 further comprising a donor layer.

12. The article of claim 11 wherein the donor layer comprises the photoacid generator.

13. The article of claim 11 wherein the donor layer is adjacent to the polymer matrix.

14. A method for patterning comprising:
   providing an article that includes an acid-etchable metallic, metal oxide, or metal nitride layer and a water-soluble polymer matrix in contact with the acid-etchable layer;
   providing a photoacid generator in contact with the water-soluble polymer matrix;
   exposing the article to actinic radiation wherein the acid generated from the photoacid generator etches the acid-etchable layer; and
   removing the matrix, wherein the polymer matrix comprises a film-forming polymer and a solubility accelerator, wherein the polymer matrix is unreactive to the photoacid generator and any acid generated by the photoacid generator, wherein the photoacid generator comprises an onium salt, and wherein the water solubility of the polymer matrix is not significantly changed upon exposure to radiation.

15. The method of claim 14 further comprising providing a donor layer adjacent to the article.

16. The method of claim 15 wherein the donor layer comprises the photoacid generator.

17. The method of claim 14 wherein the acid generated from the photoacid generator is patterned.

18. The method of claim 14 wherein exposing is done through a mask.

19. The method of claim 14 wherein the polymer matrix comprises the photoacid generator.

20. The method of claim 14 wherein removing the polymer matrix comprises washing the substrate with an aqueous solution.

21. A method for patterning a layer of an electroactive device comprising:

providing an article that includes a conductive acid-etchable metallic, metal oxide, or metal nitride layer;

disposing a water-soluble polymer matrix containing a photoacid generator in such a manner so as to be adjacent to and in contact with the acid-etchable layer;

exposing the article to actinic radiation wherein the acid generated from the photoacid generator etches the acid-etchable layer; and removing the matrix, wherein the polymer matrix comprises a film-forming polymer and a solubility accelerator, wherein the polymer matrix is unreactive to the photoacid generator and any acid generated by the photoacid generator, wherein the photoacid generator comprises an onium salt, and wherein the water solubility of the polymer matrix is not significantly changed upon exposure to radiation.

22. The method of claim 21 wherein the acid-etchable layer comprises zinc oxide.

23. The method of claim 21 wherein the photoacid generator comprises a triarylsulfonium chloride.

\* \* \* \* \*

UNITED STATES PATENT AND TRADEMARK OFFICE
CERTIFICATE OF CORRECTION

| | | |
|---|---|---|
| PATENT NO. | : 7,651,830 B2 | Page 1 of 1 |
| APPLICATION NO. | : 11/756866 | |
| DATED | : January 26, 2010 | |
| INVENTOR(S) | : Wayne S Mahoney | |

It is certified that error appears in the above-identified patent and that said Letters Patent is hereby corrected as shown below:

Column 4
Line 59; Delete "Peuro" and insert -- Puerto --, therefor.

Column 5
Line 56; Delete "diarlyiodonium" and insert -- diaryliodonium --, therefor.
Line 67; Delete "nitobenzyl" and insert -- nitrobenzyl --, therefor.

Column 6
Line 57; Delete "microns" and insert -- microns. --, therefor.

Column 10
Line 47; Delete "ARCOSOLVE" and insert -- ARCOSOLV --, therefor.

Column 11
Line 19 (Approx.); Delete "ARCOSOLVE" and insert -- ARCOSOLV --, therefor.

Column 12
Line 17; In Claim 1, after "substrate" insert -- ; --.
Line 64; In Claim 14, after "radiation" insert -- ; --.

Column 14
Line 6; In Claim 21, after "radiation" insert -- ; --.

Signed and Sealed this
Twenty-third Day of August, 2011

David J. Kappos
*Director of the United States Patent and Trademark Office*